(12) United States Patent
Jang et al.

(10) Patent No.: US 10,804,337 B2
(45) Date of Patent: Oct. 13, 2020

(54) TOUCH SENSOR IN-CELL TYPE ORGANIC ELECTROLUMINESCENT DEVICE

(71) Applicant: UNIVERSITY-INDUSTRY COOPERATION GROUP OF KYUNG HEE UNIVERSITY, Yongin-si, Gyeonggi-do (KR)

(72) Inventors: Jin Jang, Seoul (KR); Yuanfeng Chen, Seoul (KR); Jae Gwang Um, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 12 days.

(21) Appl. No.: 15/818,981

(22) Filed: Nov. 21, 2017

(65) Prior Publication Data
US 2019/0043927 A1    Feb. 7, 2019

(30) Foreign Application Priority Data
Aug. 4, 2017   (KR) .......................... 10-2017-0099238

(51) Int. Cl.
*G06F 3/041*    (2006.01)
*H01L 27/32*    (2006.01)
(Continued)

(52) U.S. Cl.
CPC .......... *H01L 27/323* (2013.01); *G06F 3/044* (2013.01); *G06F 3/0412* (2013.01);
(Continued)

(58) Field of Classification Search
CPC ..................................................... G06F 3/0412
(Continued)

(56) References Cited

U.S. PATENT DOCUMENTS

| 2007/0024546 A1* | 2/2007 | Jang ..................... G06K 9/0002 345/78 |
| 2010/0053103 A1* | 3/2010 | No ......................... G06F 3/044 345/173 |

(Continued)

FOREIGN PATENT DOCUMENTS

| JP | 2011-107701 A | 6/2011 |
| KR | 10-2008-0001774 A | 1/2008 |

(Continued)

OTHER PUBLICATIONS

Communication dated Jan. 14, 2019, issued by the Korean Patent Office in counterpart Korean Patent Application No. 10-2017-0099238.

(Continued)

*Primary Examiner* — Long D Pham
(74) *Attorney, Agent, or Firm* — Sughrue Mion, PLLC

(57) ABSTRACT

Disclosed is an in-cell type organic electroluminescent device. The in-cell type organic electroluminescent device according to an embodiment of the present disclosure includes at least one OLED-driving Thin-Film Transistor (OLED driving TFT) that is formed on a substrate and drives an organic light emitting device (OLED); the OLED connected to the at least one OLED driving TFT through a first contact hole; at least one touch-sensing thin-film transistor (though sensing TFT) that is simultaneously formed with the at least one OLED driving TFT on the substrate and senses touch; and an touch electrode that is connected to the at least one touch sensing TFT through a second contact hole and does not overlap with the OLED, wherein the at least one OLED driving TFT and the at least one touch sensing TFT share a gate line.

12 Claims, 12 Drawing Sheets

(51) Int. Cl.
*G06F 3/044* (2006.01)
*G09G 3/3275* (2016.01)
*G09G 3/3233* (2016.01)

(52) U.S. Cl.
CPC ......... *G06F 3/0416* (2013.01); *G09G 3/3233* (2013.01); *G09G 3/3275* (2013.01); *H01L 27/3262* (2013.01); *G06F 2203/04103* (2013.01); *G09G 2354/00* (2013.01)

(58) Field of Classification Search
USPC ........................................................ 345/174
See application file for complete search history.

(56) References Cited

U.S. PATENT DOCUMENTS

| | | | | |
|---|---|---|---|---|
| 2012/0038585 | A1* | 2/2012 | Kim | G06F 3/0412 345/174 |
| 2014/0035599 | A1* | 2/2014 | Shimata | G06F 3/044 324/658 |
| 2018/0061908 | A1* | 3/2018 | Shim | G09G 3/3233 |
| 2018/0114485 | A1* | 4/2018 | Kim | G09G 3/3233 |
| 2018/0130857 | A1* | 5/2018 | Lee | H01L 27/3234 |
| 2019/0043420 | A1* | 2/2019 | Jung | H01L 27/3234 |

FOREIGN PATENT DOCUMENTS

| | | |
|---|---|---|
| KR | 10-2011-0022375 A | 3/2011 |
| KR | 10-2011-0023867 A | 3/2011 |
| KR | 10-2014-0039470 A | 4/2014 |
| KR | 10-2015-0019012 A | 2/2015 |
| KR | 10-2015-0032927 A | 3/2015 |
| KR | 10-2015-0130620 A | 11/2015 |
| KR | 10-1588450 B1 | 1/2016 |
| KR | 10-1589272 B1 | 1/2016 |
| KR | 10-1637174 B1 | 7/2016 |
| KR | 10-2017-0030151 A1 | 3/2017 |
| KR | 10-2017-0033268 A | 3/2017 |
| KR | 10-2017-0033496 A | 3/2017 |
| KR | 10-2017-0051774 A | 5/2017 |
| KR | 10-2018-0051692 A | 5/2018 |

OTHER PUBLICATIONS

Communication dated Jan. 17, 2019, issued by the Korean Patent Office in counterpart Korean Patent Application No. 10-2018-0130224.

Communication dated Mar. 25, 2019, issued by the Korean Patent Office in counterpart Korean Patent Application No. 10-2017-0099238.

Communication dated Jul. 28, 2019, issued by the Korean Patent Office in counterpart Korean Patent Application No. 10-2018-0130224.

Communication dated May 12, 2020, issued by the Korean Patent Office in counterpart Korean Application No. 10-2018-0130224.

* cited by examiner

[FIG. 1A]
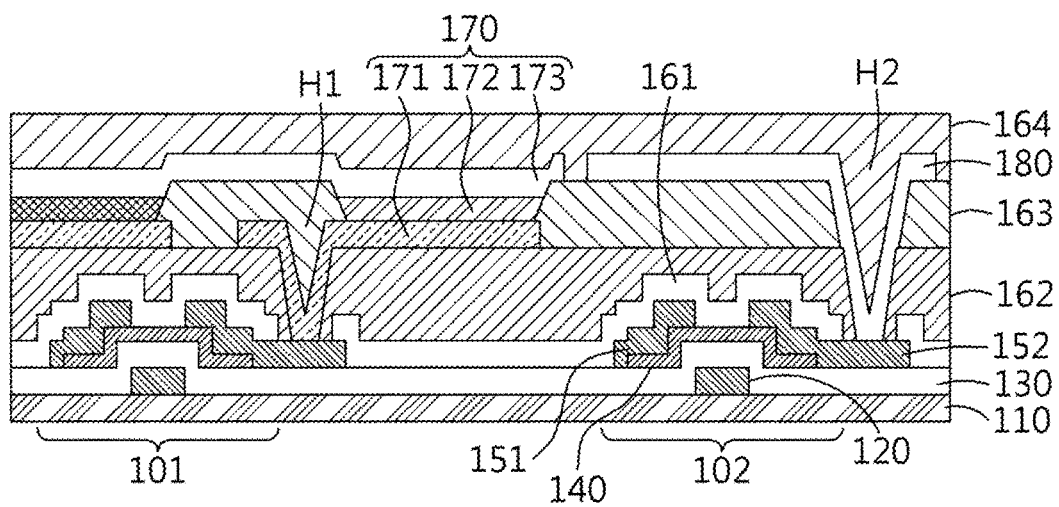
[FIG. 1B]
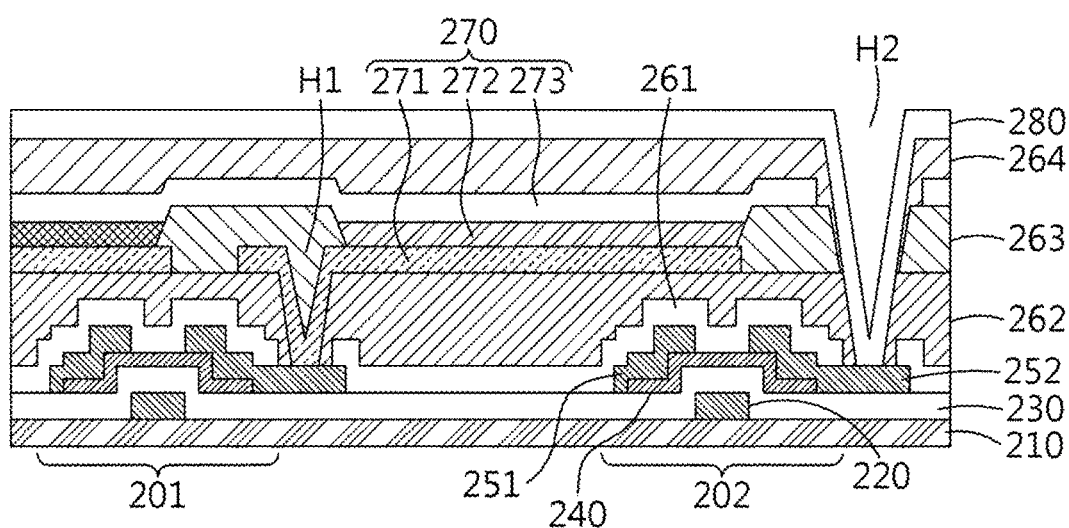

[FIG. 1C]
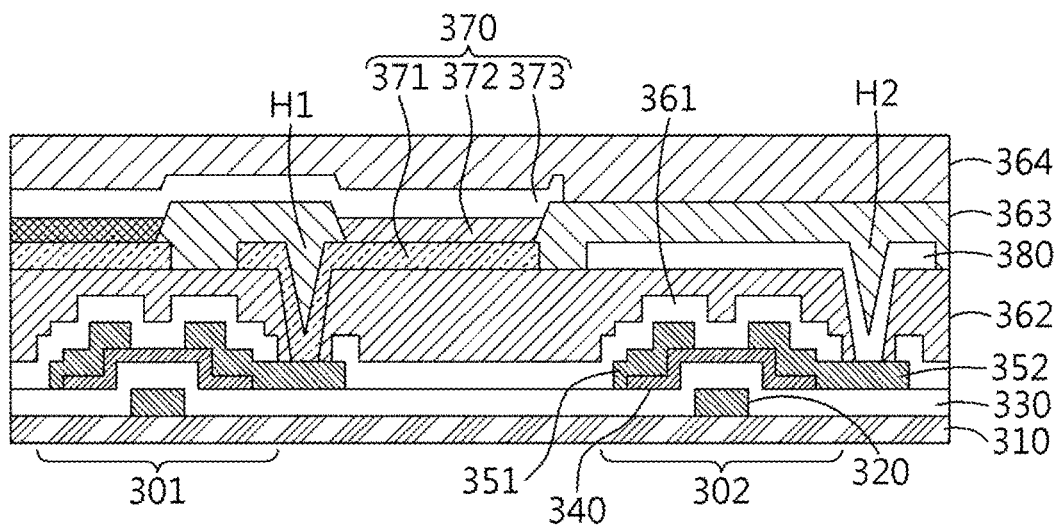
[FIG. 2A]
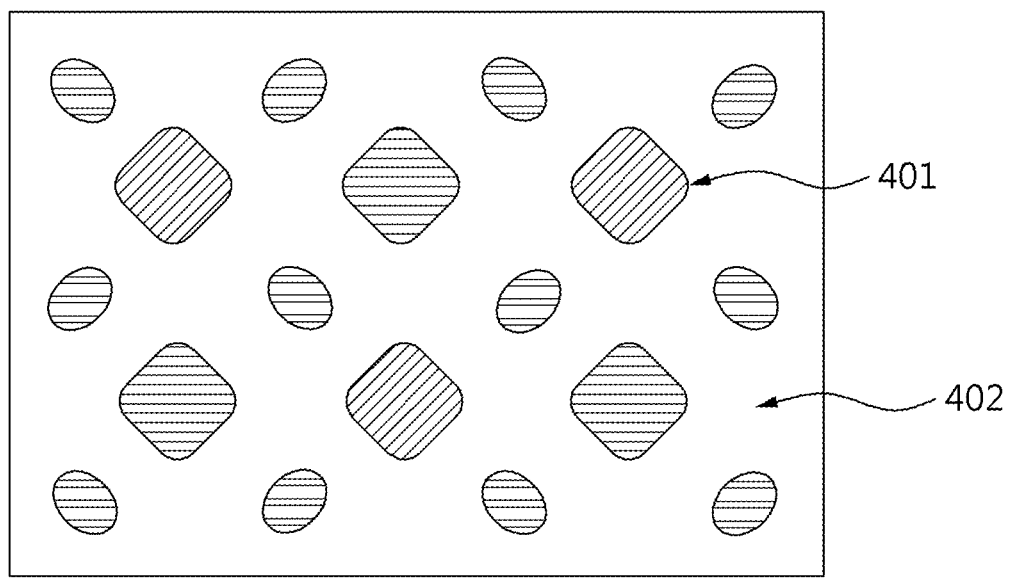

[FIG. 2B]
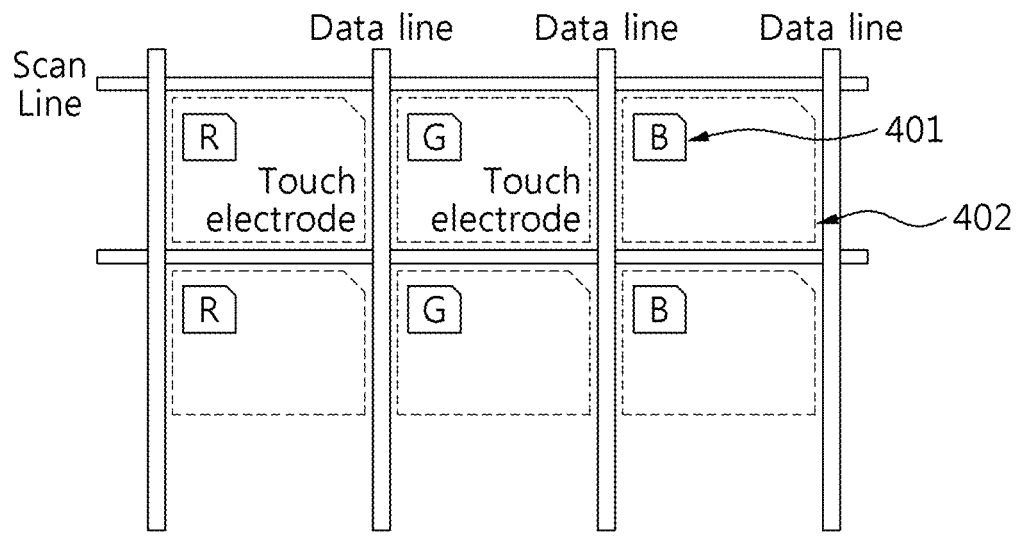
[FIG. 2C]
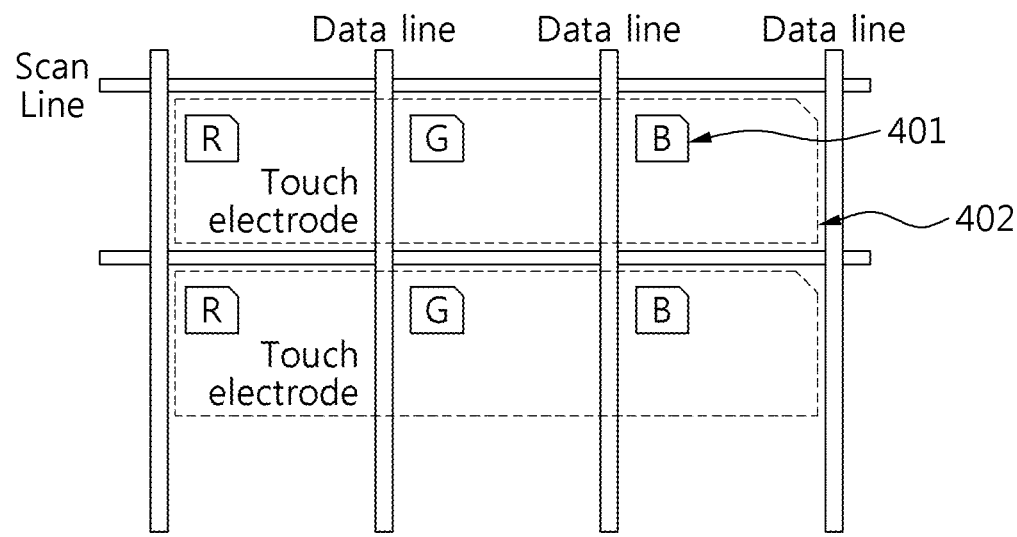

[FIG. 2D]
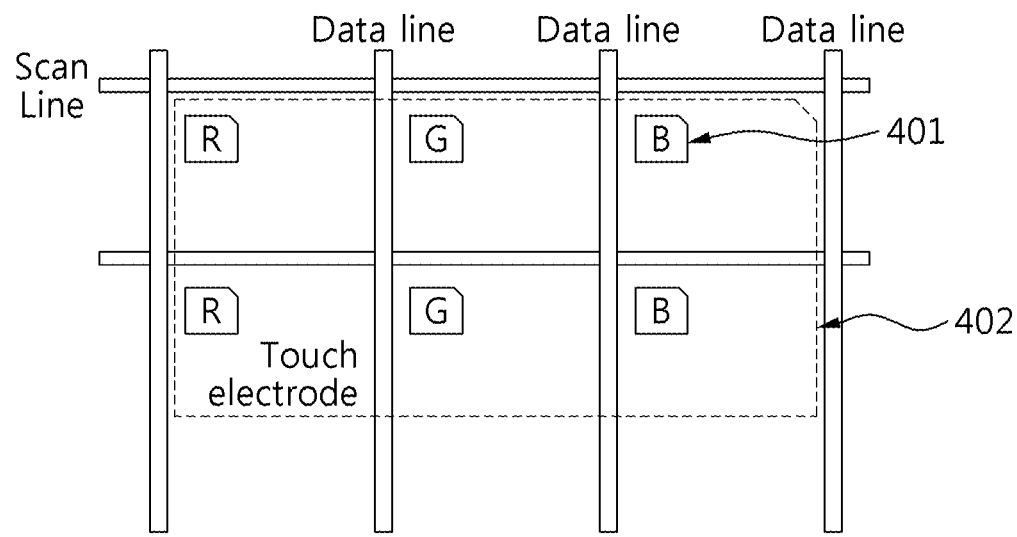
[FIG. 3]
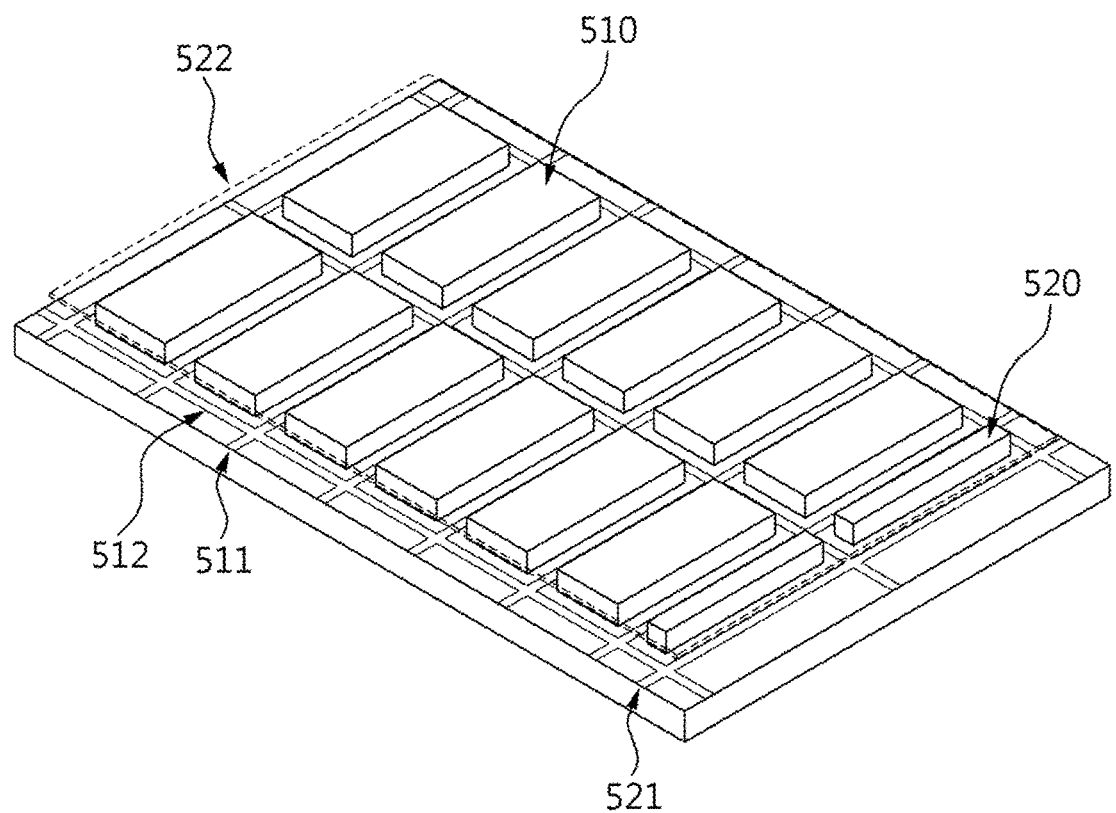

[FIG. 4]
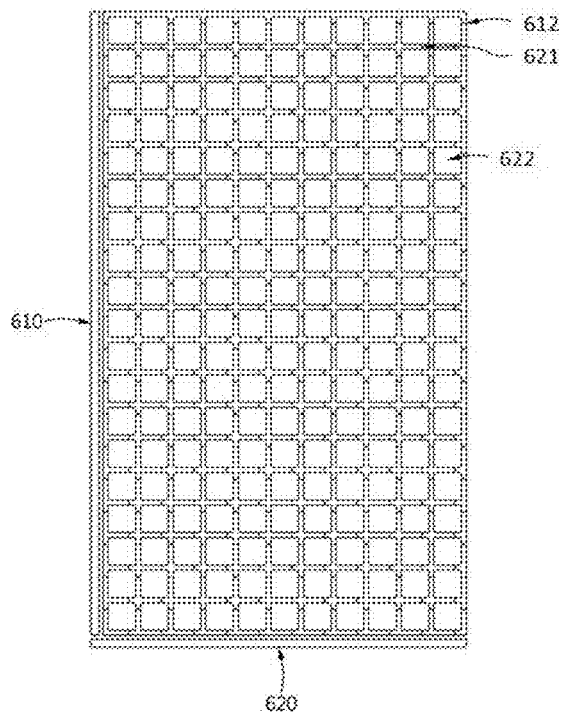
[FIG. 5A]
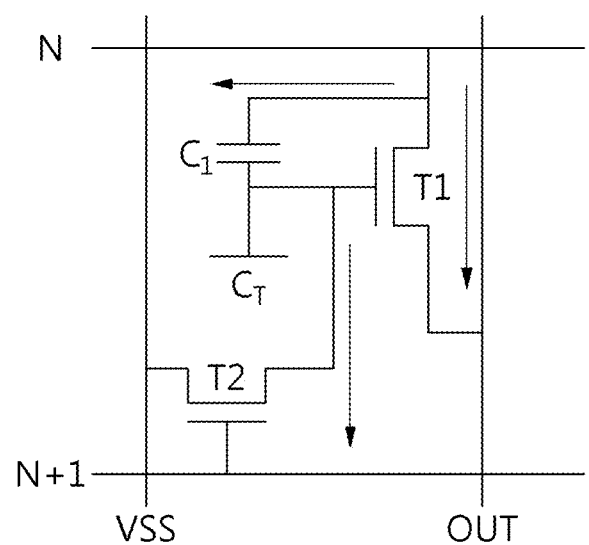

[FIG. 5B]
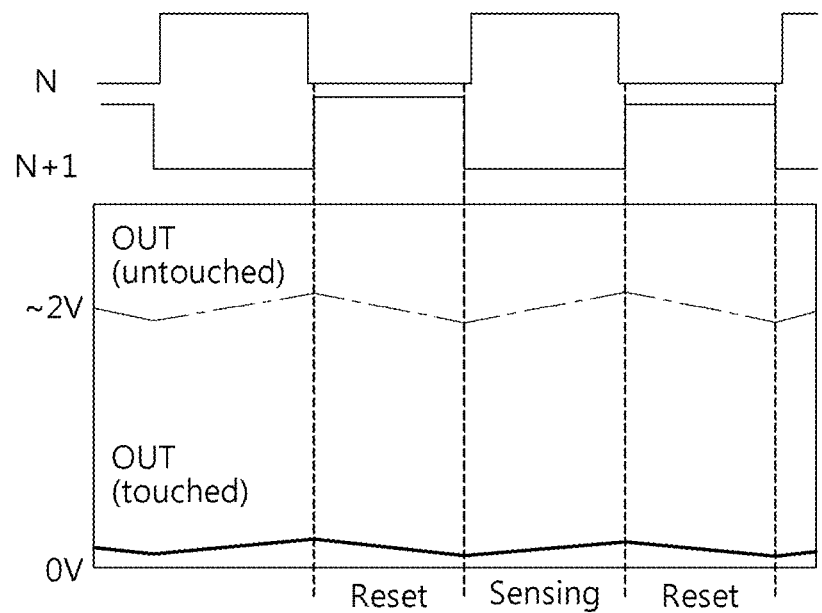
[FIG. 6]
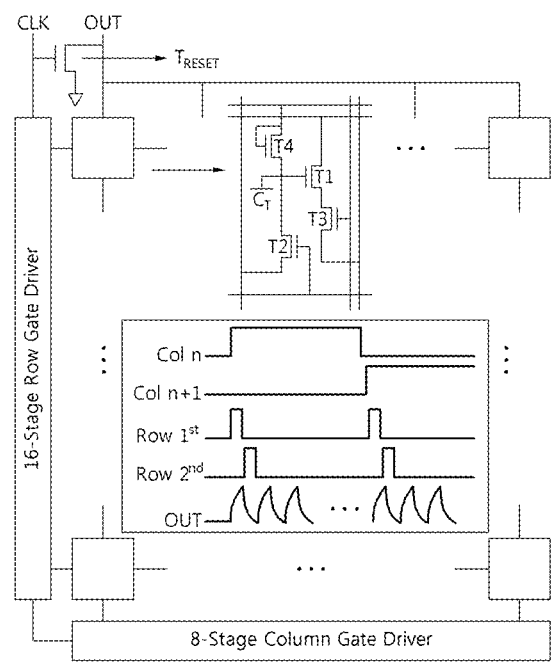

[FIG. 7A]
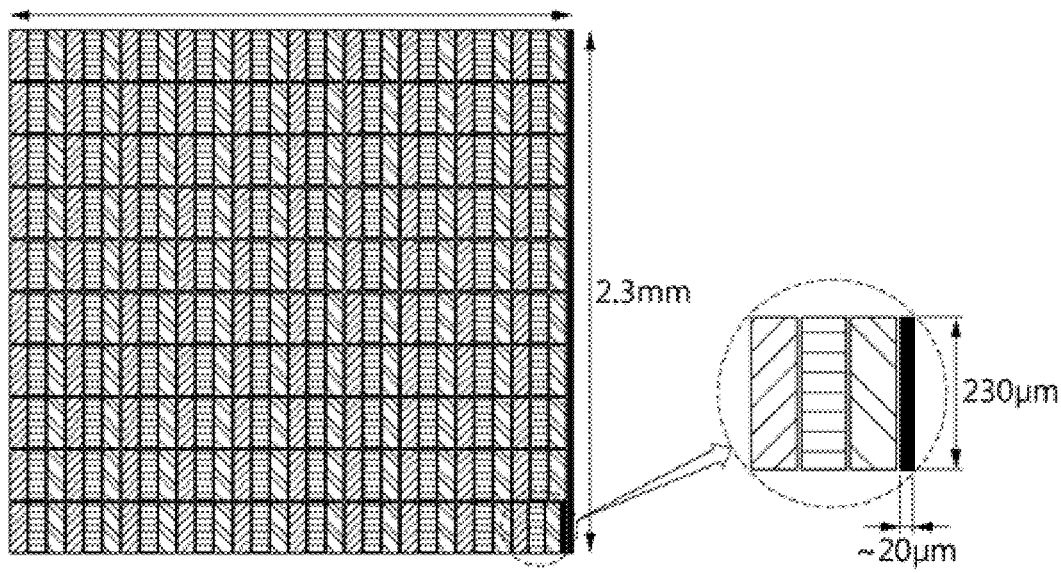
[FIG. 7B]
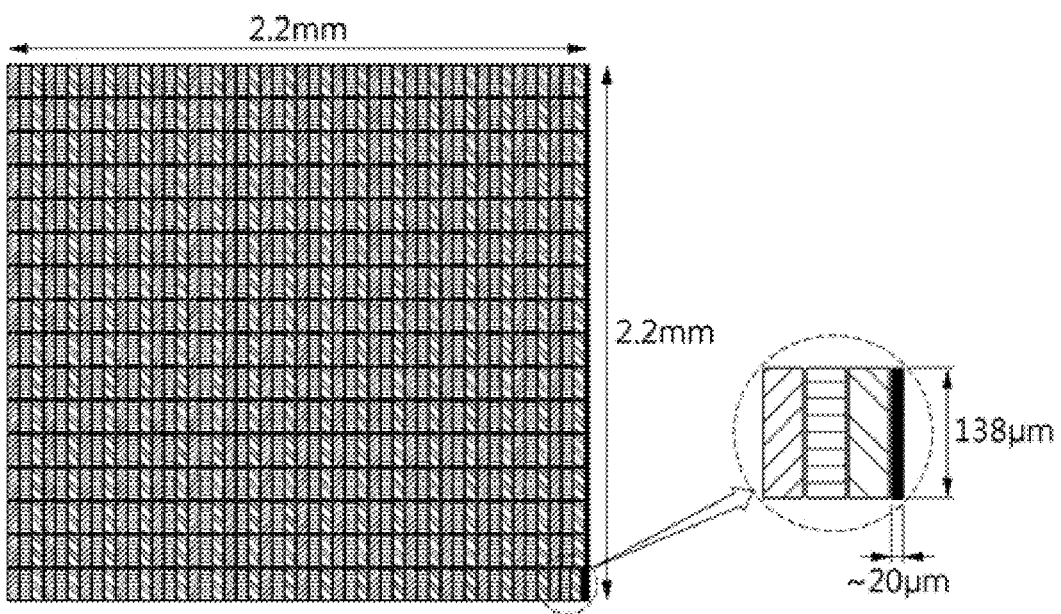

【FIG. 8】
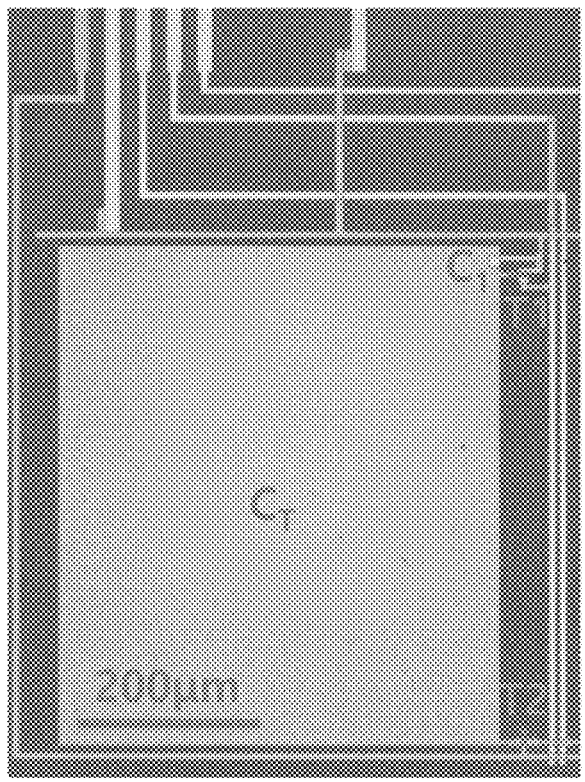
【FIG. 9A】
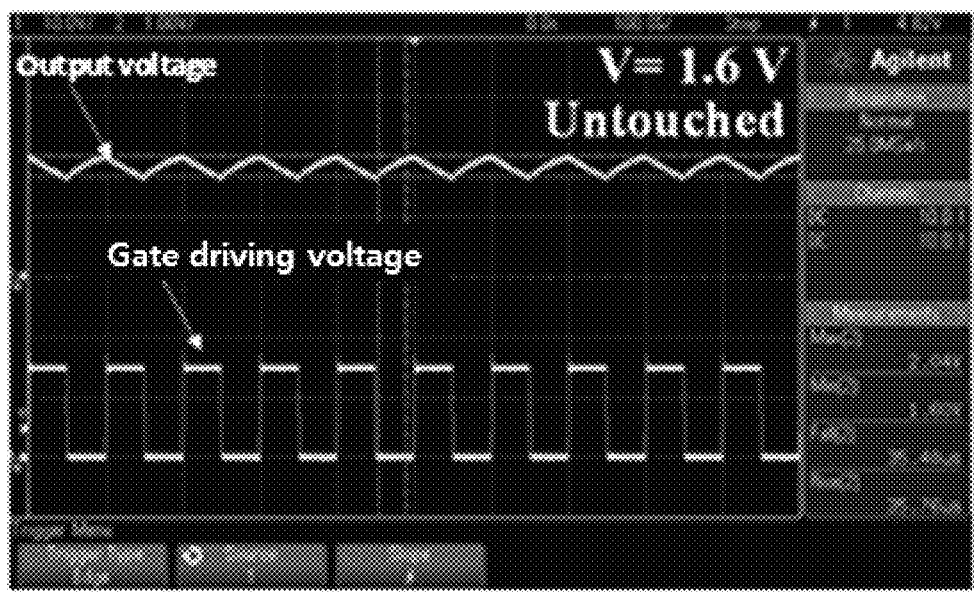

[FIG. 9B]
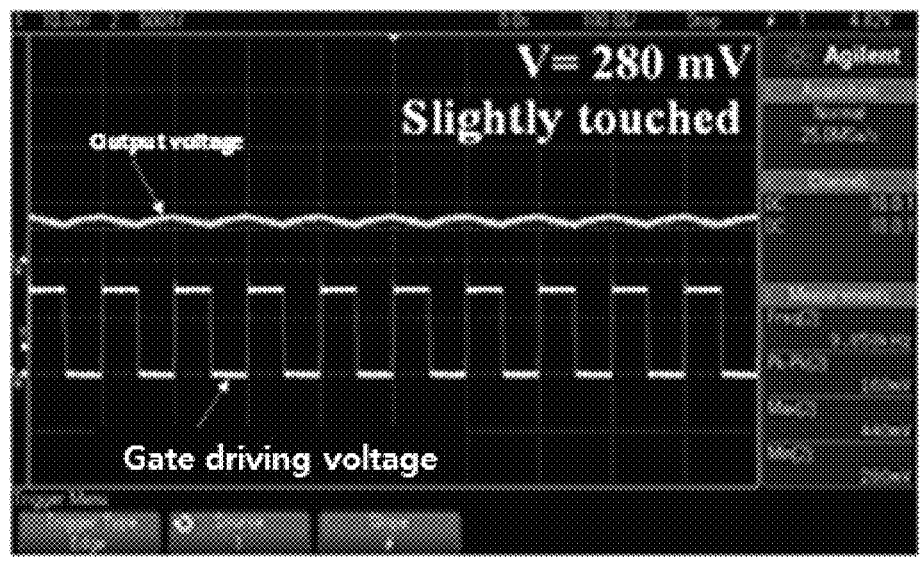
[FIG. 9C]
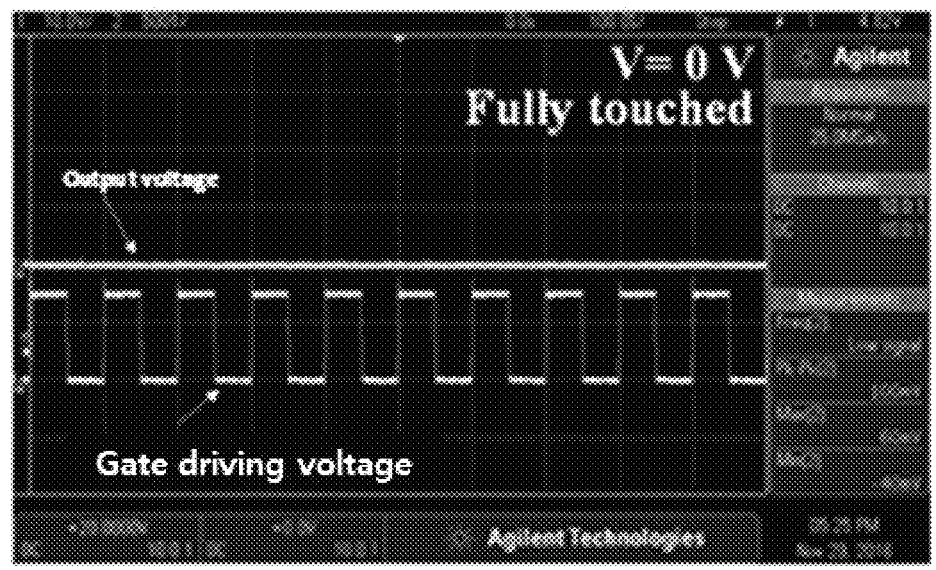

[FIG. 10A]
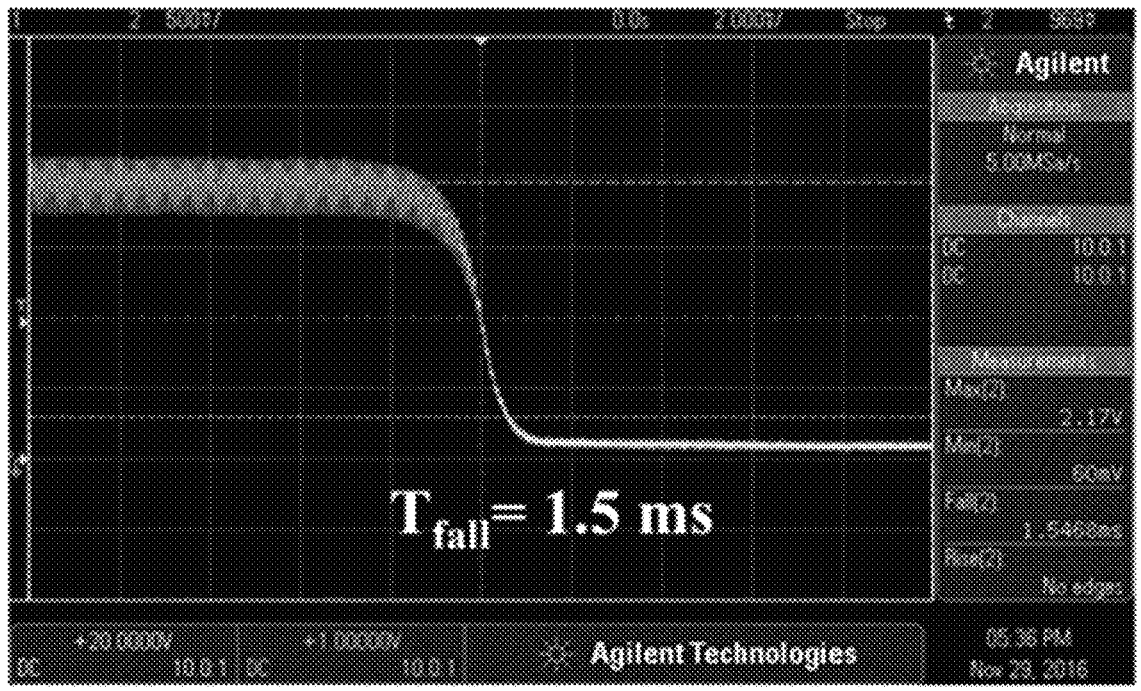
[FIG. 10B]
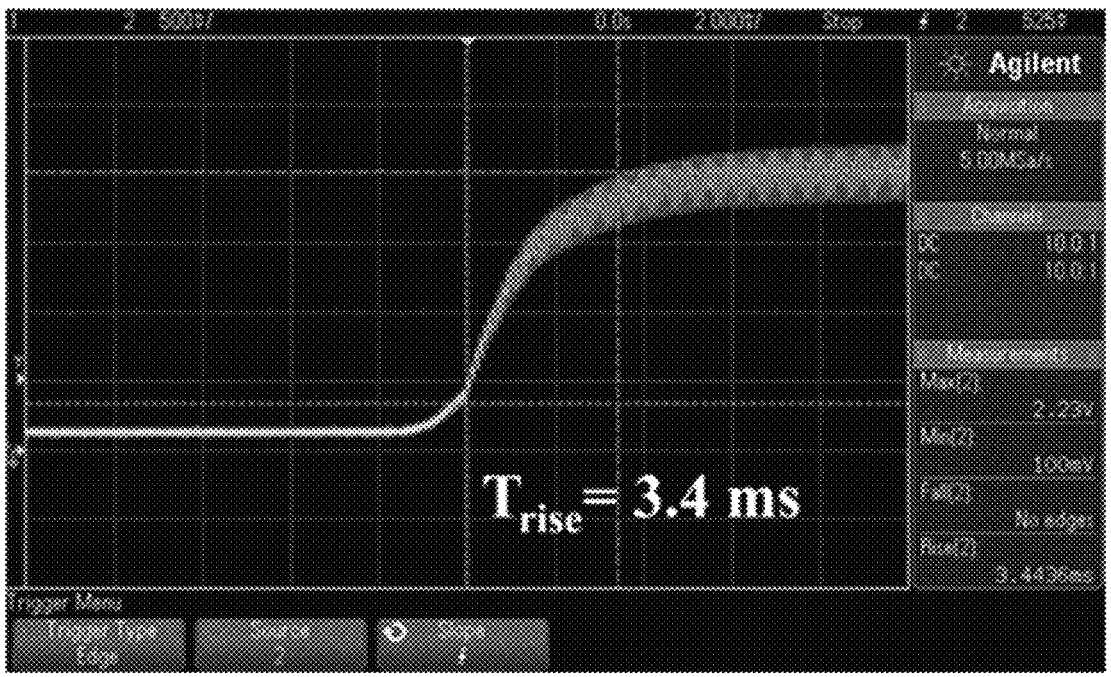

[FIG. 10C]
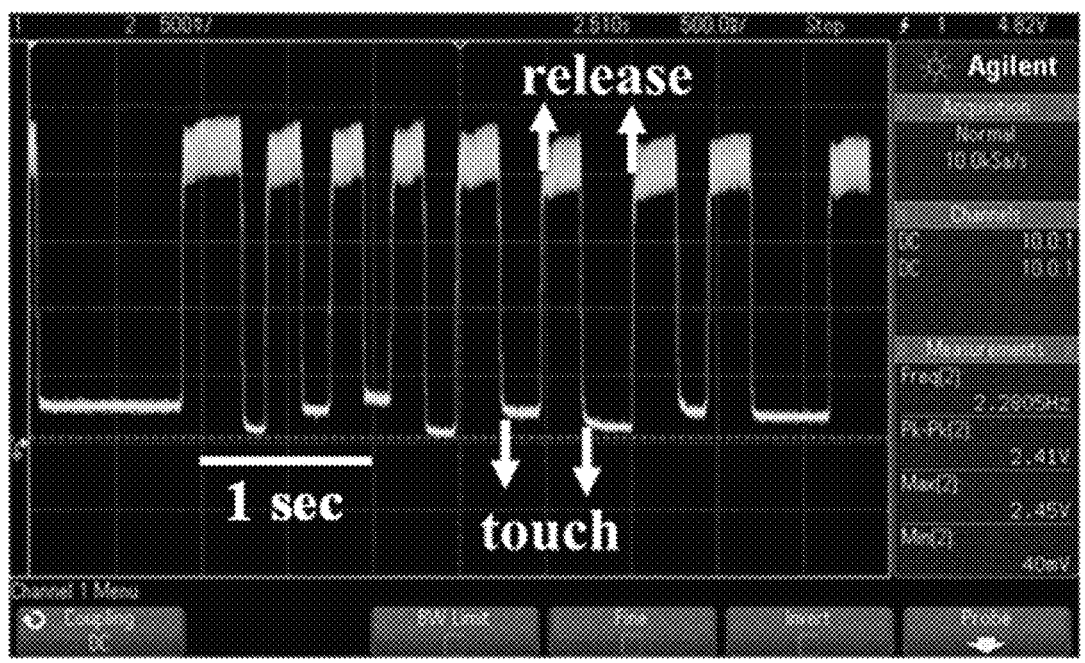
[FIG. 11]
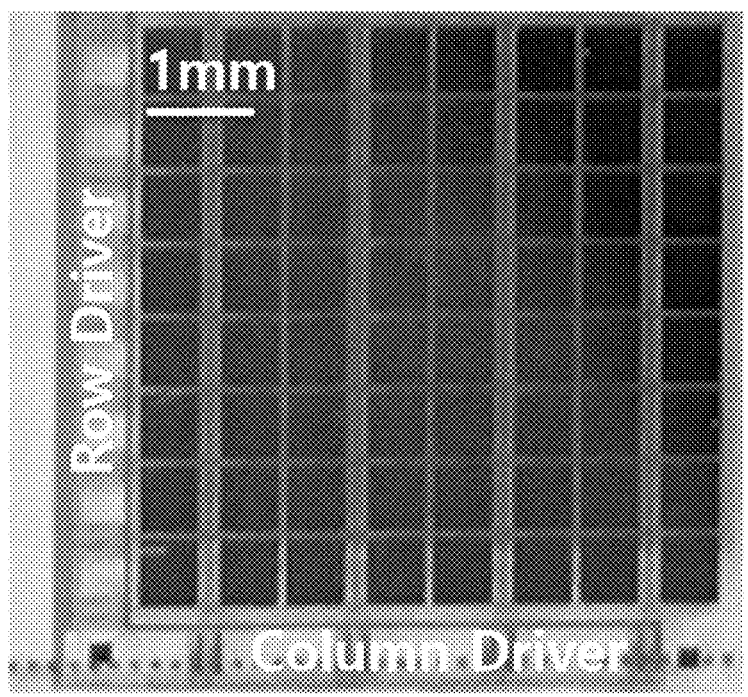

[FIG. 12]
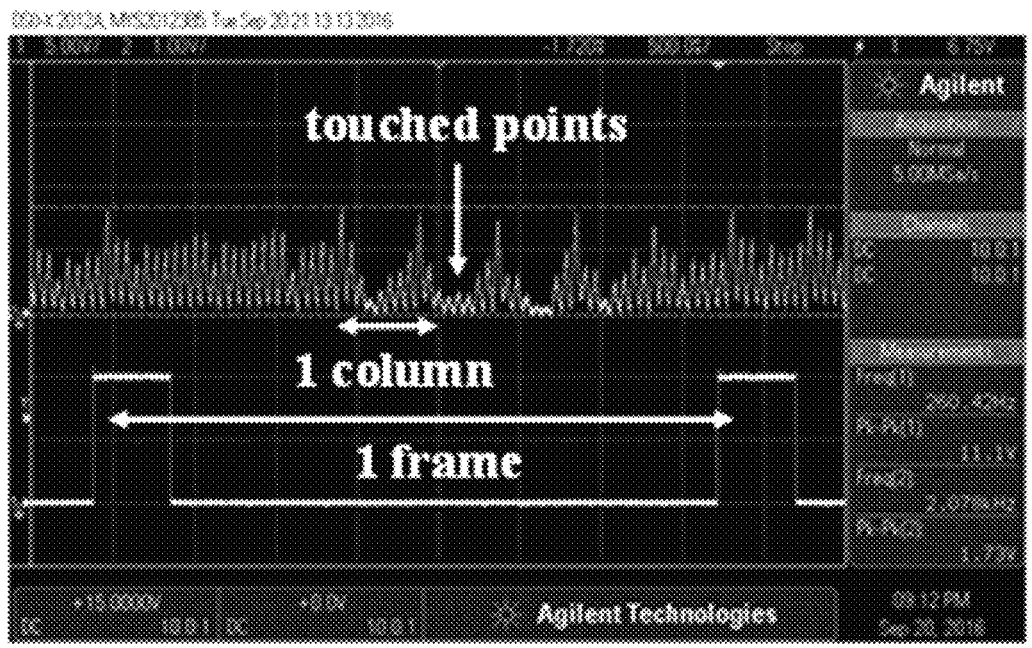
[FIG. 13]
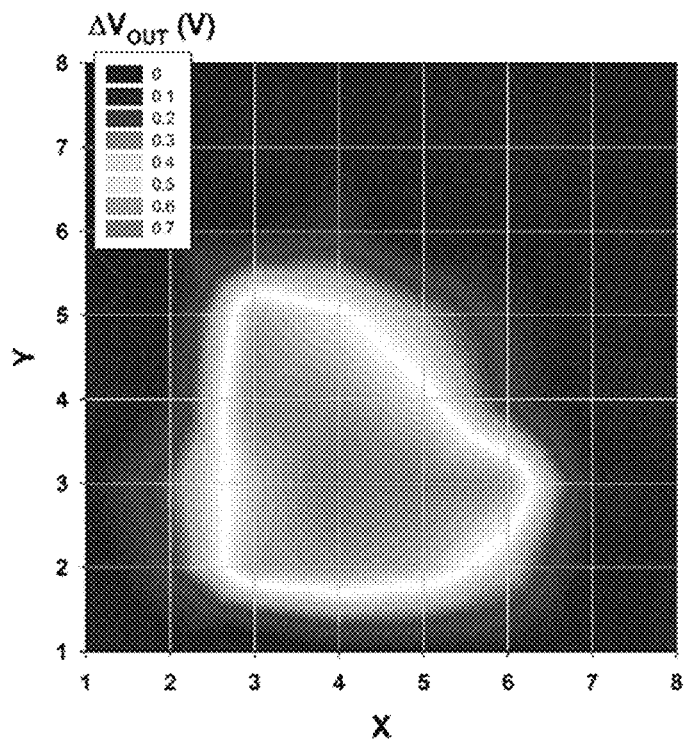

TOUCH SENSOR IN-CELL TYPE ORGANIC ELECTROLUMINESCENT DEVICE

CROSS-REFERENCE TO RELATED APPLICATION

This application claims the priority benefit of Korean Patent Application No. 10-2017-0099238, filed on Aug. 4, 2017 in the Korean Intellectual Property Office, the disclosure of which is incorporated herein by reference.

BACKGROUND OF THE DISCLOSURE

Field of the Disclosure

Embodiments of the present disclosure relate to a touch sensor in-cell type organic electroluminescent device, more particularly to a touch sensor in-cell type organic electroluminescent device having reduced thickness due to omission of a separate touch panel.

Description of the Related Art

As the information society develops, demand for display devices for displaying images is increasing in various forms. Recently, various display devices such as a Liquid Crystal Display (LCD), a Plasma Display Panel (PDP), and an Organic Light Emitting Diode (OLED) display have been utilized.

Since organic light-emitting diode (OLED) displays, which are one type of Flat Panel Display (FPD) device, is a self-emissive, OLEDs provide superior viewing angle, contrast, and the like compared to LCDs and does not require a backlight. Accordingly, OLEDs may be lightweight and thin and are advantageous in terms of power consumption. In addition, since OLEDs may be driven at DC low voltage, have fast response speed, and are solid overall, OLEDs can easily withstand shock and a wide temperature range. Especially, OLEDs are advantageous in terms of manufacturing cost.

Meanwhile, a touch-type video display device to which a user command may be input using a human hand or an object is widely used.

To accomplish this, a touch panel is provided to a front surface of a touch-type display device, whereby a position directly contacting a human hand or an object is converted into an electrical signal. Accordingly, an instruction selected at the contact position is supplied as an input signal.

As manners of realizing such a touch panel, a resistive membrane manner, a light sensing manner, a capacitive manner, and the like are known. Thereamong, a capacitive touch panel senses a change in capacitance, which a conductive sensing pattern forms with other surrounding sensing patterns, when a human hand or an object contacts the capacitive touch panel.

Such a touch panel is realized in an add-on manner wherein a separate touch panel is formed on an OLED display device.

However, a touch-type light-emitting diode display device adopting such an add-on manner has problems such as increase in overall thickness thereof due to a touch panel and manufacturing cost increase due to a separate substrate required in a touch panel formation process.

RELATED DOCUMENTS

Patent Documents

Korean Patent Application Publication No. 10-2015-0130620, entitled "DISPLAY DEVICE INTEGRATED WITH TOUCH SCREEN PANEL AND METHOD FOR FABRICATING THE SAME"

Korean Patent No. 10-1588450, entitled "Touch sensor in-cell type organic electroluminescent device"

Korean Patent No. 10-1589272, entitled "Touch sensor in-cell type organic electroluminescent device and methods of fabricating the same"

SUMMARY OF THE DISCLOSURE

Therefore, the present invention has been made in view of the above problems, and it is one object of the present invention to provide a touch sensor in-cell type organic electroluminescent device capable of providing a display device having reduced thickness and fabrication costs by integrating a backplane substrate of an organic electroluminescent device with a touch sensor to omit a separate touch panel.

It is another object of the present invention to provide an in-cell type organic electroluminescent device capable of simplifying a driving process and reducing fabrication costs by forming an OLED-driving thin-film transistor and a touch-sensing Thin-Film Transistor (TFT) to share a gate line to drive an OLED (display) and touch sensing with a single driver (drive circuit).

In accordance with an aspect of the present invention, the above and other objects can be accomplished by the provision of an in-cell type organic electroluminescent device including at least one OLED-driving Thin-Film Transistor (OLED driving TFT) that is formed on a substrate and drives an organic light emitting device (OLED); the OLED connected to the at least one OLED driving TFT through a first contact hole; at least one touch-sensing thin-film transistor (though sensing TFT) that is simultaneously formed with the at least one OLED driving TFT on the substrate and senses touch; and an touch electrode that is connected to the at least one touch sensing TFT through a second contact hole and does not overlap with the OLED, wherein the at least one OLED driving TFT and the at least one touch sensing TFT share a gate line.

The touch sensing TFT may include a gate electrode formed on the substrate; a gate insulating film formed on the gate electrode; a semiconductor layer formed on the gate insulating film; source and drain electrodes that are formed on the semiconductor layer and are spaced apart from each other; passivation layers formed on the source and drain electrodes; and a touch electrode that is formed on the passivation layers and is connected to the drain electrode through the second contact hole, wherein the touch electrode is formed on an organic light emitting layer of the OLED.

The touch sensing TFT may include a gate electrode formed on the substrate; a gate insulating film formed on the gate electrode; a semiconductor layer formed on the gate insulating film; source and drain electrodes that are formed on the semiconductor layer and are spaced apart from each other; passivation layers formed on the source and drain electrodes; and a touch electrode that is formed on the passivation layers and is connected to the drain electrode through the second contact hole, wherein the touch electrode is formed under an organic light emitting layer of the OLED.

The in-cell type organic electroluminescent device may include an emission area, in which the OLED is formed, and a touch electrode area, in which the touch electrode is formed, wherein the touch electrode area is 50% or less of a display area.

The emission area may be less than 50% of a display area.

A minimum touch capacitance value of the touch electrode may be 0.1 pF to 2 pF.

A minimum size of the touch electrode may be 2×2 mm² or less.

In accordance with another aspect of the present invention, there is provided a touch sensor in-cell type organic electroluminescent device including at least one display pixel that includes an OLED and at least one OLED driving TFT; and at least one touch sensing circuit that includes at least one touch sensing TFT connected to a touch electrode, wherein the at least one touch sensing circuit is formed at a side portion of the at least one display pixel.

The at least one OLED driving TFT and the at least one touch sensing TFT may share a gate line.

The at least one touch sensing circuit may include a first touch sensing TFT, a second touch sensing TFT, and a capacitor.

The at least one touch sensing circuit may include a first touch sensing TFT, a second touch sensing TFT, a third touch sensing TFT, a fourth touch sensing TFT, and a capacitor.

The at least one touch sensing circuit may share a gate driver for driving display pixels to be driven.

The at least one touch sensing circuit may share a data driver for driving display pixels to be driven.

In accordance with yet another aspect of the present invention, there is provided a display device including the touch sensor in-cell type organic electroluminescent device according to an embodiment of the present disclosure.

BRIEF DESCRIPTION OF THE DRAWINGS

The above and other objects, features and other advantages of the present disclosure will be more clearly understood from the following detailed description taken in conjunction with the accompanying drawings, in which:

FIGS. 1A to 1C illustrate sectional views of touch sensor in-cell type organic electroluminescent devices according to embodiments of the present disclosure;

FIGS. 2A to 2D illustrate plan views of light emitting areas and touch electrode areas of touch sensor in-cell type organic electroluminescent devices according to embodiments of the present disclosure;

FIG. 3 illustrates a stereoscopic view of display pixels and touch sensing circuits of a touch sensor in-cell type organic electroluminescent device according to embodiments of the present disclosure;

FIG. 4 illustrates a plan view of a touch sensor in-cell type organic electroluminescent device according to an embodiment of the present disclosure;

FIG. 5A illustrates a circuit diagram of a touch sensing circuit of 2T1C included in a touch sensor in-cell type organic electroluminescent device according to embodiments of the present disclosure;

FIG. 5B is a timing diagram graph illustrating a change in output voltage of a touch sensing circuit included in a touch sensor in-cell type organic electroluminescent device according to embodiments of the present disclosure according to a touched/untouched state;

FIG. 6 illustrates a circuit diagram of a touch sensing circuit of 4T1C included in a touch sensor in-cell type organic electroluminescent device according to embodiments of the present disclosure;

FIGS. 7A and 7B illustrate touch sensor in-cell type organic electroluminescent devices having different touch sensing circuit sizes according to embodiments of the present disclosure;

FIG. 8 illustrates a single touch sensing circuit included in a touch sensor in-cell type organic electroluminescent device according to embodiments of the present disclosure;

FIGS. 9A to 9C are timing diagram graphs illustrating change in output voltage of each of touch sensing circuits included in touch sensor in-cell type organic electroluminescent devices according to embodiments of the present disclosure according to a touch state;

FIGS. 10A to 10C are timing diagram graphs illustrating change in output voltage of each of touch sensing circuits included in touch sensor in-cell type organic electroluminescent devices according to embodiments of the present disclosure according to repeated touch;

FIG. 11 illustrates 8×8 touch sensing circuits and a scan driver of a touch sensor in-cell type organic electroluminescent device according to embodiments of the present disclosure;

FIG. 12 is a timing diagram graph illustrating change in voltage of 8×8 touch sensing circuits of a touch sensor in-cell type organic electroluminescent device according to embodiments of the present disclosure according to a touched point; and FIG. 13 is a graph illustrating change in voltage of 8×8 touch sensing circuits of a touch sensor in-cell type organic electroluminescent device according to embodiments of the present disclosure in a touched/untouched state.

DETAILED DESCRIPTION OF THE DISCLOSURE

Hereinafter, the embodiments of the present invention are described with reference to the accompanying drawings and the description thereof but are not limited thereto.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated constituents, steps, operations, and/or devices, but do not preclude the presence or addition of one or more other constituents, steps, operations, and/or devices.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

Further, as used in the description of the invention and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element, such as a layer, a film, an area, or a constituent, is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, a touch sensor in-cell type organic electroluminescent device according to embodiments of the present disclosure is described with reference to FIGS. 1A to 1C.

FIGS. 1A to 1C illustrate sectional views of touch sensor in-cell type organic electroluminescent devices according to embodiments of the present disclosure.

A touch sensor in-cell type organic electroluminescent device according to an embodiment of the present disclosure is formed on a substrate 110, 210, or 310, and includes at least one organic light emitting device (OLED)-driving Thin-Film Transistor (OLED driving TFT; 101, 201, 301) driving an OLED 170, 270, or 270; and the OLED 170, 270, or 270 connected to at least one OLED driving TFT 101, 201, or 301 through a first contact hole H1.

In addition, the touch sensor in-cell type organic electroluminescent device includes at least one touch-sensing TFT 102, 202, or 302, which is formed along with the at least one OLED driving TFT 101, 201, or 301 on the substrate 110, 210, or 310 and senses touch; and a touch electrode 180, which is connected to the at least one touch-sensing Thin-Film Transistor (TFT) 102 through a second contact hole H2 and does not overlap with the OLED 170, 270, or 270.

In addition, the at least one OLED driving TFT 101, 201, or 301 and the at least one touch-sensing TFT 102, 202, or 302 share a gate line and thus drive the OLED (display) and touch sensing with a single driver (drive circuit), thereby simplifying a driving process and reducing fabrication costs.

The technology wherein the at least one OLED driving TFT 101, 201, or 301 and the at least one touch-sensing TFT 102, 202, or 302 share the gate line is described in more detail in FIG. 3.

In addition, in the touch sensor in-cell type organic electroluminescent devices according to embodiments of the present disclosure, a backplane substrate is integrated with a touch sensor, whereby a separate touch panel is omitted. Accordingly, the thickness and fabrication costs of a display device may be reduced.

The backplane substrate refers to a backplane substrate in which components of a driving thin-film transistor and a storage capacitor are included. The backplane substrate may be used not only in an OLED but also in a liquid crystal display device and other display devices.

In addition, according to an embodiment, the at least one OLED driving TFT 101, 201, or 301 and the at least one touch-sensing TFT 102, 202, or 302 respectively illustrated in FIGS. 1A to 1C may have an inverted structure or a co-planar structure.

In the case of a thin film transistor having an inverted structure, a gate electrode is attached to a substrate. In the case of a thin film transistor having a co-planar structure, a source/drain electrode, a gate insulating film, and a gate electrode are formed on a semiconductor layer.

In addition, the at least one OLED driving TFT 101 and at least one touch sensing TFT 102 of the touch sensor in-cell type organic electroluminescent device according to an embodiment of the present disclosure are simultaneously formed in the same process.

More particularly, the touch sensor in-cell type organic electroluminescent device according to an embodiment of the present disclosure may be simultaneously formed on the substrate 110 in the aforementioned process, except for a process of forming the OLED 170 on the at least one OLED driving TFT 101 using the first contact hole H1 and a process of forming the touch electrode 180 on the at least one touch sensing TFT 102 using the second contact hole H2.

In addition, the at least one OLED driving TFT 101 and the at least one touch sensing TFT 102 of the touch sensor in-cell type organic electroluminescent device according to an embodiment of the present disclosure are simultaneously formed in the same process, whereby a process may be simplified and fabrication costs may be reduced.

In addition, the touch sensor in-cell type organic electroluminescent devices according to embodiments of the present disclosure are used as display devices.

The touch sensor in-cell type organic electroluminescent devices according to embodiments of the present disclosure illustrated in FIGS. 1A to 1C include the same constituents, except for the position of a touch electrode. Accordingly, the same constituents are only described in FIG. 1A.

FIG. 1A is a sectional view illustrating a touch sensor in-cell type organic electroluminescent device according to a first embodiment of the present disclosure.

The substrate 110 is a substrate for supporting the at least one OLED driving TFT 101 and the at least one touch sensing TFT 102. As the substrate 110, a substrate having flexibility may be used, and the substrate 110 may be bent or folded in a specific direction. For example, the substrate 110 may be folded in a horizontal direction, a vertical direction, or a diagonal direction.

Preferably, the substrate 110 may include any one of silicon, glass, polyester, polyvinyl, polycarbonate, polyethylene, polyacetate, polyimide, polyethersulfone (PES), polyacrylate (PAR), polyethylene naphthalate (PEN), and polyethylene teterephthalate (PET).

A gate electrode 120 is formed on 120 the substrate 110.

The gate electrode 120 may be formed by depositing a gate conductive film (not shown), forming a photoresist pattern on the gate conductive film, and selectively etching (patterning) the gate conductive film using the photoresist pattern as a mask.

The gate electrode 120 may include a metal or metal oxide as an electrically conductive material. In particular, the gate electrode 120 may be composed of at least any one material of metals, such as molybdenum (Mo), aluminum (Al), chrome (Cr), gold (Au), titanium (Ti), silver (Ag), nickel (Ni), neodymium (Nd), and copper (Cu), and metal oxides, such as Indium Tin Oxide (ITO), Indium Zinc Oxide (IZO), and Indium Tin Zinc Oxide (ITZO), or a combination thereof, but the present disclosure is not limited thereto.

In addition, the gate electrode 120 may be formed in a single layer structure or double layer structure including the aforementioned substance.

On the gate electrode 120, a gate insulating film 130 insulating the gate electrode 120 and a semiconductor layer 140 is formed.

An inorganic substance, such as silicon oxide (SiOx), silicon nitride (SiNx), titanium oxide (TiOx), or hafnium oxide (HfOx), or an organic substance, such as polyvinyl alcohol (PVA), polyvinyl pyrrolidone (PVP), or polymethyl methacrylate (PMMA), may be used as the gate insulating film 130, but the present disclosure is not limited thereto.

In addition, the gate insulating film 130 may be formed a single layer structure or double layer structure including the aforementioned substance by a deposition method or a coating method.

The semiconductor layer 140 is formed on the gate insulating film 130.

The semiconductor layer 140 may be formed on the gate insulating film 130. The semiconductor layer 140 may be formed by forming a semiconductor film for forming the semiconductor layer 140, forming a photoresist pattern, and patterning the semiconductor film using the photoresist pattern as a mask.

In addition, the semiconductor layer 140 may include a channel area, in which a channel is formed, and source and drain areas, to which source and drain electrodes 151 and 152 are respectively connected.

The semiconductor layer 140 may include at least any one of Low-Temperature Polycrystalline Silicon (LTPS), Indium Gallium Zinc Oxide (IGZO), Zinc Oxide (ZnO), Indium Zinc Oxide (IZO), Indium Tin Oxide (ITO), Zinc Tin Oxide (ZTO), Gallium Zinc Oxide (GZO), Hafnium Indium Zinc Oxide (HIZO), Zinc Indium Tin Oxide (ZITO), and Aluminum Zinc Oxide (AZTO), but the present disclosure is not limited thereto.

In addition, the semiconductor layer 140 may be amorphous or polycrystalline including the aforementioned substance.

In addition, the semiconductor layer 140 may be formed by a Chemical Vapor Deposition (CVD) method or a Physical Vapor Deposition (PVD) method.

On the semiconductor layer 140, the source and drain electrodes 151 and 152 spaced apart from each other are formed.

The source and drain electrodes 151 and 152 may be spaced apart from each other and formed on the semiconductor layer 140, and may be electrically connected to the semiconductor layer 140.

The source and drain electrodes 151 and 152 may be formed by depositing a conductive film (hereinafter referred to as a "source/drain conductive film") for forming the source and drain electrodes 151 and 152, forming a photoresist pattern on the source/drain conductive film, and patterning the source/drain conductive film using the photoresist pattern as a mask.

The source and drain electrodes 151 and 152 may be formed of a metal substance. For example, the source and drain electrodes 151 and 152 may be composed of any one of molybdenum (Mo), aluminum (Al), chrome (Cr), gold (Au), titanium (Ti), nickel (Ni), neodymium (Nd), and copper (Cu) or a combination thereof, but the present disclosure is not limited thereto.

In addition, the source and drain electrodes 151 and 152 may be formed in a single layer structure or double layer structure including the aforementioned substance.

Passivation layers 161, 162, 163, and 164 are formed on the source and drain electrodes 151 and 152.

Preferably, the passivation layers 161, 162, 163, and 164 may include the first passivation layer 161 protecting the at least one OLED driving TFT 101 and the at least one touch sensing TFT 102, the second passivation layer 162 planarizing surfaces of the at least one OLED driving TFT 101 and the at least one touch sensing TFT 102, the third passivation layer 163 serving as a bank for exposing a light emitting area including the OLED 170, and the fourth passivation layer 164 protecting the at least one OLED driving TFT 101 and the at least one touch sensing TFT 102.

The first passivation layer 161 may be formed on the source and drain electrodes 151 and 152 and may protect the at least one OLED driving TFT 101 and the at least one touch sensing TFT 102.

At least any one of inorganic substances, such as silicon oxide (SiOx), silicon nitride (SiNx), titanium oxide (TiOx), and hafnium oxide (HfOx) and organic substances, such as polyvinyl alcohol (PVA), polyvinyl pyrrolidone (PVP), and polymethyl methacrylate (PMMA), may be used as the first passivation layer 161, but the present disclosure is not limited thereto.

In addition, the first passivation layer 161 may be formed in a single layer structure or double layer structure including the aforementioned substance.

The second passivation layer 162 planarizing surfaces of the at least one OLED driving TFT 101 and the at least one touch sensing TFT 102 is formed on the first passivation layer 161.

At least any one of inorganic substance, such as silicon oxide (SiOx), silicon nitride (SiNx), titanium oxide (TiOx), and hafnium oxide (HfOx) and organic substances, such as polyvinyl alcohol (PVA), polyvinyl pyrrolidone (PVP), and polymethyl methacrylate (PMMA), may be used as the second passivation layer 162, but the present disclosure is not limited thereto.

In addition, the second passivation layer 162 may be formed in a single layer structure or double layer structure including the aforementioned substance.

On the second passivation layer 162, the first contact hole H1 for connecting a drain electrode of the at least one OLED driving TFT 101 to the OLED 170 formed in a subsequent process is formed.

The first contact hole H1 is formed by etching the first and second passivation layers 161 and 162, and, inside the first contact hole H1, the OLED anode 171 connected to an organic light emitting layer 172 of the OLED 170 may be included.

The OLED anode 171 may be formed by depositing an electrically conductive substance in the first contact hole H1, and selectively etching (patterning) the electrically conductive substance using the photoresist pattern as a mask.

Accordingly, the OLED anode 171 may be formed inside the first contact hole H1 and on a surface of the second passivation layer 162.

The OLED anode 171 may include an electrically conductive metal or metal oxide. In particular, the OLED anode 171 may be composed of at least any one material of metals, such as molybdenum (Mo), aluminum (Al), chrome (Cr), gold (Au), titanium (Ti), silver (Ag), nickel (Ni), neodymium (Nd), and copper (Cu), and metal oxides, such as Iridium Tin Oxide (ITO), Indium Zinc Oxide (IZO), and Indium Tin Zinc Oxide (ITZO), or a combination thereof, but the present disclosure is not limited thereto.

On the second passivation layer 162, the third passivation layer 163 serving as a bank for exposing the OLED 170 is formed.

The third passivation layer 163 is provided to define the OLED 170 of a light emitting area, and portions of the third passivation layer 163 may be highly formed to relatively protrude.

The OLED 170 includes the OLED anode (171), an OLED cathode 173 opposite to the OLED anode (171), and the organic light emitting layer 172 disposed between the OLED anode 171 and the OLED cathode 173.

FIG. 1A illustrates positions of the OLED anode 171, the organic light emitting layer 172, and the OLED cathode 173, but the present disclosure is not limited thereto. Positions of of the OLED cathode 173, the organic light emitting layer 172, and the OLED anode 171 are also possible.

In accordance with an embodiment, an electron transporting layer or an electron injection layer may be further included between the OLED anode 171 and the organic light emitting layer 172, and a hole injection layer or a hole transport layer may be further included between the organic light emitting layer 172 and the OLED cathode 173.

The OLED cathode 173 is formed on the third passivation layer 163 and an organic light emitting layer, and the OLED anode 171 may include an electrically conductive metal or metal oxide. In particular, the OLED anode 171 may be formed of at least any one material of metals, such as molybdenum (Mo), aluminum (Al), chrome (Cr), gold (Au), titanium (Ti), silver (Ag), nickel (Ni), neodymium (Nd), and copper (Cu), and metal oxides, such as Indium Tin Oxide (ITO), Indium Zinc Oxide (IZO), and Indium Tin Zinc Oxide (ITZO), or a combination thereof, but the present disclosure is not limited thereto.

In addition, the third passivation layer 163 includes the second contact hole H2 for connecting the at least one touch sensing TFT 102 to the touch electrode 180.

The second contact hole H2 may be formed by etching the first to third passivation layers 161 to 163.

After depositing an electrically conductive substance inside the second contact hole H2, the electrically conductive substance may be selectively etched (patterned) using the photoresist pattern as a mask.

By selectively etching (patterning) the electrically conductive substance using the photoresist pattern as a mask after depositing the electrically conductive substance inside the second contact hole H2, the touch electrode 180 connected to the drain electrode 152 of the at least one touch sensing TFT 102 is formed.

Accordingly, the touch electrode 180 may be formed inside the second contact hole H2 and on the third passivation layer 163.

The touch electrode 180 may be formed on the third passivation layer 163 by connecting the touch electrode 180 to the at least one touch sensing TFT 102 using the second contact hole H2.

In addition, the touch electrode 180 may be composed of at least any one material or a combination thereof metals, such as molybdenum (Mo), aluminum (Al), chrome (Cr), gold (Au), titanium (Ti), silver (Ag), nickel (Ni), neodymium (Nd), and copper (Cu), and metal oxides, such as Indium Tin Oxide (ITO), Indium Zinc Oxide (IZO), and Indium Tin Zinc Oxide (ITZO), but the present disclosure is not limited thereto.

In addition, according to an embodiment, the touch electrode 180 and the OLED cathode 173 may be formed in the same process after forming the second contact hole H2 so as to simplify a process.

Referring to FIG. 1A, the touch electrode 180 of the touch sensor in-cell type organic electroluminescent device according to the first embodiment of the present disclosure may be formed on the organic light emitting layer 172 of the OLED 170.

Accordingly, the touch electrode 180 of the touch sensor in-cell type organic electroluminescent device according to the first embodiment of the present disclosure and the OLED cathode 173 of the OLED 170 may be formed in the same layer, and the touch electrode 180 does not overlap with the OLED 170.

More particularly, the touch electrode 180 may be formed on the third passivation layer 163 (bank) and in an area except for an area in which the OLED 170 is formed. Accordingly, deterioration of electrical or optical characteristics due to interaction between the OLED 170 and the touch electrode 180 during driving of a display may be prevented.

Accordingly, since the touch electrode 180 is not formed on a pixel electrode (not shown) in the case of the touch sensor in-cell type organic electroluminescent device according to the first embodiment of the present, transmittance may be improved.

The touch electrode 180 may have a minimum touch capacitance value of 0.1 pF to 2 pF. When the touch electrode 180 has a minimum touch capacitance value of less than 0.1 pF, a sensing signal is small, whereby noise increases. Since 2 pF is a sufficiently large value, there is a problem in terms of a yield.

A minimum size of the touch electrode 180 may be 2×2 mm$^2$. To produce a sufficient capacitance, preferably a capacitance of 0.1 pF, for sensing a touch, a minimum size of the touch electrode 180 should be 2×2 mm$^2$ or less.

Preferably, a minimum size of the touch electrode 180 may be 1.3×1.3 mm$^2$.

The fourth passivation layer 164 is formed on the third passivation layer 163 on which the OLED anode 171 and the touch electrode 180 are formed.

At least any one of inorganic substances, such as silicon oxide (SiOx), silicon nitride (SiNx), titanium oxide (TiOx), and hafnium oxide (HfOx), and organic substances, such as polyvinyl alcohol (PVA), polyvinyl pyrrolidone (PVP), and polymethyl methacrylate (PMMA), may be used as the fourth passivation layer 164, but the present disclosure is not limited thereto.

In addition, the fourth passivation layer 164 may be formed in a single layer structure or double layer structure including the aforementioned substance.

FIG. 1B is a sectional view illustrating a touch sensor in-cell type organic electroluminescent device according to a second embodiment of the present disclosure.

The touch sensor in-cell type organic electroluminescent device illustrated in FIG. 1B includes the same components as FIG. 1A except that a touch electrode 280 is formed on the OLED 270 and a fourth passivation layer 264. Accordingly, description of the same components is omitted.

In the case of the touch sensor in-cell type organic electroluminescent device according to the second embodiment of the present disclosure, the touch electrode 280 is formed on the fourth passivation layer 264 and the touch electrode 280 does not overlap with the OLED 270.

Accordingly, in the case of the touch sensor in-cell type organic electroluminescent device according to the second embodiment of the present disclosure, the second contact hole H2 may be formed by etching the first to fourth passivation layers 261 to 264 so as to connect at least one touch sensing TFT 202 to the touch electrode 280.

The second contact hole H2 is formed by etching the first to fourth passivation layers 261 to 264. After depositing an electrically conductive substance inside the second contact hole H2, the electrically conductive substance may be selectively etched (patterned) using the photoresist pattern as a mask.

Accordingly, the touch electrode 280 may be formed inside the second contact hole H2 and on the fourth passivation layer 264.

The touch electrode 280 may be formed on the fourth passivation layer 264 by connecting the touch electrode 280 to the at least one touch sensing TFT 202 using the second contact hole H2.

In addition, the touch electrode 280 may be composed of at least any one material of metals, such as molybdenum (Mo), aluminum (Al), chrome (Cr), gold (Au), titanium (Ti), and silver (Ag), nickel (Ni), neodymium (Nd), and copper (Cu), and metal oxides, such as Iridium Tin Oxide (ITO), Indium Zinc Oxide (IZO), and Iridium Tin Zinc Oxide (ITZO), or a combination thereof, but the present disclosure is not limited thereto.

Referring to FIG. 1B, the touch electrode 280 may be formed on an organic light emitting layer 272 of the OLED 270.

More particularly, the touch electrode 280 is formed on the fourth passivation layer 264 and in an area except for an area in which the OLED 270 is formed. Accordingly, deterioration of electrical or optical characteristics due to interaction between the OLED 270 and the touch electrode 280 during driving of a display may be prevented.

Accordingly, since disclosure the touch electrode 280 is not formed on a pixel electrode (not shown) in the case of the touch sensor in-cell type organic electroluminescent device according to the second embodiment of the present, transmittance may be improved.

FIG. 1c is a sectional view illustrating the touch sensor in-cell type organic electroluminescent device according to the third embodiment of the present disclosure.

The touch sensor in-cell type organic electroluminescent device illustrated in FIG. 1c includes the same components as FIG. 1A except that a touch electrode 380 is formed under an organic light emitting layer 372 of an OLED 370. Accordingly, description of the same components is omitted.

Accordingly, in the case of the touch sensor in-cell type organic electroluminescent device according to the third embodiment of the present disclosure, the second contact hole H2 may be formed by etching the first and second passivation layers 361 and 362 so as to connect between at least one touch sensing TFT 302 and the touch electrode 380.

The second contact hole H2 is formed by etching the first and second passivation layers 361 and 362. After depositing an electrically conductive substance inside the second contact hole H2, the electrically conductive substance may be selectively etched (patterned) using the photoresist pattern as a mask.

Accordingly, the touch electrode 380 may be formed inside the second contact hole H2 and on the second passivation layer 362.

The touch electrode 380 may be formed on the second passivation layer 362 by connecting the touch electrode 380 to the at least one touch sensing TFT 302 using the second contact hole H2.

In addition, the touch electrode 380 may be composed of at least any one material of metals, such as molybdenum (Mo), aluminum (Al), chrome (Cr), gold (Au), titanium (Ti), and silver (Ag), nickel (Ni), neodymium (Nd), and copper (Cu), and metal oxides, such as Iridium Tin Oxide (ITO), Indium Zinc Oxide (IZO), and Iridium Tin Zinc Oxide (ITZO), or a combination thereof, but the present disclosure is not limited thereto.

Referring to FIG. 1C, the touch electrode 380 may be formed under an organic light emitting layer 372 of the OLED 370.

Accordingly, the touch electrode 380 of the touch sensor in-cell type organic electroluminescent device according to the third embodiment of the present disclosure and an OLED cathode 373 of the OLED 370 may be formed in the same layer, and the touch electrode 380 does not overlap with the OLED 370.

More particularly, the touch electrode 380 is formed on the second passivation layer 362 and in an area except for an area in which the OLED 370 is formed. Accordingly, deterioration of electrical or optical characteristics due to interaction between the OLED 370 and the touch electrode 380 during driving of a display may be prevented.

Accordingly, since disclosure the touch electrode 380 is not formed on a pixel electrode (not shown) in the case of the touch sensor in-cell type organic electroluminescent device according to the third embodiment of the present, transmittance may be improved.

In addition, in the case of the touch sensor in-cell type organic electroluminescent device according to the third embodiment of the present disclosure, first and second contact holes H1 and H2 are fabricated in the same process, and then the OLED cathode 373 and the touch electrode 380 are fabricated in the same process, so as to simplify a process.

FIGS. 2A to 2D illustrate plan views of light emitting areas and touch electrode areas of the touch sensor in-cell type organic electroluminescent devices according to embodiments of the present disclosure.

Referring to FIG. 2A, the touch sensor in-cell type organic electroluminescent device according to an embodiment of the present disclosure may include emission areas 401, in which an OLED is formed, and a touch electrode area 402, in which a touch electrode is formed.

The touch electrode area 402 includes at least one touch electrode having various shapes and sizes. The touch electrode area 402 may be 50% or less of a display area.

In addition, the touch electrode having various shapes and sizes included in the touch electrode area 402 is described with reference to FIGS. 2B to 2D.

The emission areas 401 are areas in which light is emitted though an OLED. Each of the emission areas 401 may include at least one OLED and at least one of a red (R) OLED, a green (G) OLED, a blue (B) OLED, and a white (W) OLED depending upon an organic light emitting layer of the at least one OLED.

The emission areas 401 may be less than 50% of a display area.

In addition, the touch electrode area 402 may be formed not to overlap with the emission areas 401, and the touch electrode area 402 may be formed not to overlap with the emission areas 401. Accordingly, during driving of a display, deterioration of electrical or optical characteristics due to interaction between the OLED and the touch electrode may be prevented.

Referring to FIG. 2B, each of touch electrodes of a touch sensor in-cell type organic electroluminescent device according to an embodiment of the present disclosure may be formed to include only one OLED among RGB OLEDs.

Accordingly, the touch electrode area 402 may include a plurality of touch electrodes, each of which includes only one OLED among RGB OLEDs.

Referring to FIG. 2C, each of touch electrodes of a touch sensor in-cell type organic electroluminescent device according to an embodiment of the present disclosure may be formed to include all of RGB OLEDs.

Accordingly, the touch electrode area 402 may include a plurality of touch electrodes, each of which includes all of RGB OLEDs.

Referring to FIG. 2D, each of touch electrodes of a touch sensor in-cell type organic electroluminescent device according to an embodiment of the present disclosure may be formed to include two or more of each of the R, G, and B OLEDs.

Accordingly, the touch electrode area 402 may include a plurality of touch electrodes including two or more of each of the R, G, and B OLEDs.

Accordingly, referring to FIGS. 2A to 2D, the touch sensor in-cell type organic electroluminescent devices according to embodiments of the present disclosure may have touch electrodes having various structures.

FIG. 3 illustrates a stereoscopic view of display pixels and touch sensing circuits of a touch sensor in-cell type organic electroluminescent device according to an embodiment of the present disclosure.

The touch sensor in-cell type organic electroluminescent device according to an embodiment of the present disclosure includes at least one display pixel 510 including an OLED and at least one OLED driving TFT; and at least one touch sensing circuit 520 including at least one touch sensing TFT connected to a touch electrode 522.

In addition, the at least one touch sensing circuit 520 may be formed at a side portion of the at least one display pixel 510.

In addition, at least one OLED driving TFT of the at least one display pixel 510 and at least one touch sensing TFT of the at least one touch sensing circuit 520 may share a gate line 512.

The at least one display pixel 510 may include at least one OLED driving TFT, which is connected to pixel data lines 511 and gate lines 512, in a pixel area defined by forming the pixel data lines 511 and the gate lines 512 to cross each other on a substrate.

A source or drain electrode of at least one OLED driving TFT may be connected to the pixel data line 511, and a gate electrode thereof may be connected to the gate line 512.

In addition, the at least one touch sensing circuit 520 may include at least one touch sensing TFT, which is connected to a touch sensor data line 521 and the gate lines 512, in a touch sensing circuit area defined by forming the touch sensor data line 521 and the gate lines 512 to cross each other.

A source or drain electrode of the at least one touch sensing TFT may be connected to the touch sensor data line 521, and the gate electrode may be connected to the gate lines 512.

Accordingly, the at least one OLED driving TFT and the at least one touch sensing TFT are connected to the same gate line, whereby an OLED (display) and touch sensing are driven by a single driver (drive circuit). Accordingly, a driving process may be simplified and fabrication costs may be reduced.

FIG. 4 illustrates a plan view of a touch sensor in-cell type organic electroluminescent device according to an embodiment of the present disclosure.

Each of display areas of the touch sensor in-cell type organic electroluminescent device according to an embodiment of the present disclosure may include a display pixel formed by crossing the pixel data lines 611 with a connection part 612 between touch electrodes connected to a gate driver. Touch electrodes 622 may be formed on the display pixel such that the touch electrodes 622 correspond to display pixels.

In addition, the display areas of the touch sensor in-cell type organic electroluminescent device according to an embodiment of the present disclosure includes first to fourth sides. A gate driver 610 may be formed at the first side, and a data driver 620 (e.g., data driver & touch readout) may be formed at the second side perpendicular to the gate driver 610.

The gate driver 610, which is also referred to as a "scan driver", sequentially supplies a scan signal to a plurality of gate lines, thereby sequentially driving the gate lines.

In addition, the gate driver 610 may sequentially supply a scan signal of an On voltage or Off voltage to the gate lines under control of a timing controller (not shown).

When a specific gate line is opened by the gate driver 610, the data driver 620 may convert image data received from a timing controller (not shown) into analog data voltage and may supply the converted analog data voltage to a plurality of data lines.

In addition, the data driver 620 may supply a driving signal to the gate lines, and may detect raw data for each touch node using a read-out signal that is output from a read-out line of a touch sensing circuit.

An element necessary for touch sensing may be classified into a touch sensing circuit and touch driving.

The at least one touch sensing circuit of the touch sensor in-cell type organic electroluminescent device according to an embodiment of the present disclosure may share a gate driver for driving display pixels to be driven, or may share a data driver for driving display pixels to be driven.

Further, the at least one touch sensing circuit of the touch sensor in-cell type organic electroluminescent device according to an embodiment of the present disclosure may share both a gate driver for driving display pixels and a data driver for driving display pixels.

Conventionally, to drive the touch electrodes 622, a driver for touch and a specific connection state to drive the driver were required.

However, in the case of the touch sensor in-cell type organic electroluminescent device according to an embodiment of the present disclosure, the gate driver 610 and data driver 620 (e.g., data driver & touch readout, column gate driver), which have been used to drive a pixel, are utilized, and the touch electrodes 622 and connection parts (the connection part 612 between the touch electrodes 622 connected to the gate driver 610; and the connection part 621 between the touch electrodes 622 connected to the data driver 620) between touch electrodes 622 which respectively connect x and y axes of the touch electrodes 622 are included. The touch electrodes 622 may have the same connection structure as drivers provided to drive display pixels.

Accordingly, the touch sensor in-cell type organic electroluminescent device according to an embodiment of the present disclosure may connect and drive the at least one touch sensing circuit and pixel circuit without distinguishing the same.

Accordingly, since the at least one touch sensing circuit of the touch sensor in-cell type organic electroluminescent device according to an embodiment of the present disclosure is driven while sharing a gate driver or data driver for driving display pixels, a constitution of the at least one touch sensing circuit is further simplified. Accordingly, the touch sensor in-cell type organic electroluminescent device may be driven in a simple driving mode, and fabrication costs of a gate driver and data driver for touch may be reduced.

FIG. 5A illustrates a circuit diagram of a touch sensing circuit of 2T1C included in the touch sensor in-cell type organic electroluminescent device according to an embodiment of the present disclosure.

The touch sensing circuit, which has an active touch sensing circuit structure, N, may be driven by gate drivers of N and N+1; and wires corresponding to source voltage (VSS) and output.

In addition, the touch sensing circuit may have a 2T1C structure including a first touch sensing TFT (T1), a second touch sensing TFT (T2), and a capacitance ($C_1$).

The first touch sensing TFT (T1), which is a touch-driving thin-film transistor (Driving TFT), may adjust touch sensing voltage and sense touch.

In addition, the first touch sensing TFT (T1) is turned on according to a gate pulse from a gate line (N, N+1), and a touch-switching thin-film transistor may adjust current flowing to a touch sensor output processing unit through a lead-out line by voltage (gate voltage) of a node changed according to the present or absence of touch.

The second touch sensing TFT (T2) may turn off the first touch sensing TFT (T1) and may perform a reset function.

In addition, a gate electrode of the second touch sensing TFT (T2) may be connected to the gate line (N, N+1) such that the second touch sensing TFT (T2) shares the gate line (N, N+1) with an OLED driving TFT.

The capacitance ($C_1$) may include an area capacitance due to the area of a touch electrode; and a gap capacitance due to the thickness of passivation layers.

Accordingly, in the case of the touch sensor in-cell type organic electroluminescent device according to an embodiment of the present disclosure, all touch electrodes have the same area and the thickness of passivation layers are constant when touch is not generated. Accordingly, touch sensing circuits have the same capacitance.

However, when the touch sensor in-cell type organic electroluminescent device according to an embodiment of the present disclosure is touched with a finger, a touch capacitance ($C_T$) is naturally generated, which causes change in total capacitance ($C_1+C_T$) of the touched portion. Accordingly, whether touch has been made may be recognized and operation due to touch is performed.

More particularly, when the touch sensor in-cell type organic electroluminescent device according to an embodiment of the present disclosure is not touched, all touch sensing circuits included in a display area have the same capacitance ($C_1$). When the touch sensor in-cell type organic electroluminescent device according to an embodiment of the present disclosure is touched, a touch capacitance ($C_T$) is added to the touched portion, whereby a total capacitance ($C_1+C_T$) of the touched portion is changed. Accordingly, whether touch is generated may be sensed.

FIG. 5B is a timing diagram graph illustrating a change in output voltage of a touch sensing circuit included in the touch sensor in-cell type organic electroluminescent device according to an embodiment of the present disclosure according to a touched/untouched state.

Referring to FIG. 5B, the touch sensing circuit included in the touch sensor in-cell type organic electroluminescent device according to an embodiment of the present disclosure has an output voltage of about 2 V when not touched. When the touch sensing circuit is touched, the touch sensing circuit has an output voltage of about 0 V. Accordingly, a touched state and an untouched state are clearly distinguished, whereby touch state may be sensed with high sensitivity.

FIG. 6 illustrates a circuit diagram of a touch sensing circuit of 4T1C included in the touch sensor in-cell type organic electroluminescent device according to an embodiment of the present disclosure.

The 4T1C touch sensing circuit illustrated in FIG. 6 may include the same components as the 2T1C touch sensing circuit of FIG. 5A.

The touch sensing circuit of the touch sensor in-cell type organic electroluminescent device according to an embodiment of the present disclosure may have a 4T1C structure including a first touch sensing TFT, a second touch sensing TFT, a third touch sensing TFT, a fourth touch sensing TFT, and a capacitor.

The 4T1C touch sensing circuit of the touch sensor in-cell type organic electroluminescent device according to an embodiment of the present disclosure simultaneously shares a gate line and a data line (column line). Accordingly, the 4T1C touch sensing circuit may share both a gate driver and a data driver to be driven.

Accordingly, although a touch sensing circuit of the touch sensor in-cell type organic electroluminescent device according to an embodiment of the present disclosure becomes complex due to inclusion of the 4T1C touch sensing circuit, the constitution of the touch sensing circuit is further simplified because the constitution of the touch sensing circuit simultaneously uses X-Y driving (gate line and data line). Accordingly, the touch sensor in-cell type organic electroluminescent device may be driven in a simple driving mode, and fabrication costs of a gate driver and data driver for touch may be reduced.

In addition, since the touch sensor in-cell type organic electroluminescent device according to an embodiment of the present disclosure includes the 4T1C touch sensing circuit, both the gate driver and the touch sensing circuit may be incorporated.

FIGS. 7A and 7B illustrate touch sensor in-cell type organic electroluminescent devices having different touch sensing circuit sizes according to embodiments of the present disclosure.

Referring to FIG. 7A, black parts represent touch sensing circuits of the touch sensor in-cell type organic electroluminescent device according to an embodiment of the present disclosure. Here, each of the touch sensing circuits may have a width of 20 μm or less and a height of 260 μm.

FIG. 7A illustrates an embodiment wherein a touch sensing circuit for a 40-inch UHD is applied to a pixel. Here, when a pixel size is 230×230 μm$^2$, a touch electrode may have a size of ~2×2 mm$^2$, a touch sensing circuit may have a size of ~20×230 μm$^2$, and an area occupied by the touch sensing circuit per pixel may be <~0.09%.

Referring to FIG. 7B, black parts represent touch sensing circuits of the touch sensor in-cell type organic electroluminescent device according to an embodiment of the present disclosure. Here, each of the touch sensing circuit may have a width of 20 μm or less and a height of 138 μm.

FIG. 7B illustrates an embodiment wherein a touch sensing circuit for a 24-inch UHD is applied to a pixel. Here, when a pixel size is 138×138 μm$^2$, a touch electrode may have a size of ~2×2 mm$^2$, a touch sensing circuit may have a size of ~20×138 μm$^2$, and an area occupied by the touch sensing circuit per pixel may be <~0.06%.

FIG. 8 illustrates a single touch sensing circuit included in the touch sensor in-cell type organic electroluminescent device according to an embodiment of the present disclosure.

Referring to FIG. 8, it can be confirmed that a single touch sensing circuit included in the touch sensor in-cell type organic electroluminescent device according to an embodiment of the present disclosure includes two transistors and one capacitor.

FIGS. 9A to 9C are timing diagram graphs illustrating change in output voltage of each of the touch sensing circuits included in the touch sensor in-cell type organic electroluminescent devices according to embodiments of the present disclosure according to a touch state.

As illustrated in FIGS. 9A to 9C, the touch sensor in-cell type organic electroluminescent devices according to embodiments of the present disclosure have a touch sensing circuit driving voltage (VDD) of 15 V, a frame rate of 5 kHz, and a touch electrode size of 500 μm$^2$.

FIG. 9A illustrates change in output voltage of a touch sensing circuit included in the touch sensor in-cell type organic electroluminescent device according to an embodiment of the present disclosure in an untouched state, FIG. 9B illustrates change in output voltage of a touch sensing circuit included in the touch sensor in-cell type organic electroluminescent device according to an embodiment of the present disclosure in a slightly touched state, and FIG. 9C illustrates change in output voltage of a touch sensing circuit included in the touch sensor in-cell type organic electroluminescent device according to an embodiment of the present disclosure in a fully touched state.

Referring to FIGS. 9A to 9C, the touch sensing circuit included in the touch sensor in-cell type organic electroluminescent device according to an embodiment of the present disclosure in untouched state exhibits an output voltage of 1.6 V. However, depending upon touch sensitivity, an output voltage is converted into 280 mV in the slightly touched state and is converted into 0 V in a fully touched state.

Accordingly, it can be confirmed that voltage state of the touch sensor in-cell type organic electroluminescent device according to an embodiment of the present disclosure changes depending upon a touch degree.

FIGS. 10A to 10C are timing diagram graphs illustrating change in output voltage of each of the touch sensing circuits included in the touch sensor in-cell type organic electroluminescent devices according to embodiments of the present disclosure according to repeated touch.

As illustrated in FIGS. 10A to 10C, a fall time and rise time of sensed touch voltage when touched were measured.

Referring to FIGS. 10A to 10C, the fall time (Tfall) is 1.5 ms, and the rise time (Trise) is 3.4 ms. In particular, referring to FIG. 10c, voltage is dynamically changed in a touched state and a release state.

FIG. 11 illustrates 8×8 touch sensing circuits and a scan driver of a touch sensor in-cell type organic electroluminescent device according to embodiments of the present disclosure.

As illustrated in FIG. 11, when a row driver is a gate driver, a column driver may be a data driver. When the row driver is a data driver, the column driver may be a gate driver.

Referring to FIG. 11, it can be confirmed that a row driver is formed at a side of the 8×8 touch sensing circuits of the touch sensor in-cell type organic electroluminescent device according to embodiments of the present disclosure and a column driver is formed at a side perpendicular to the row driver.

In addition, the row driver and the column driver respectively refer to a gate driver and column gate driver for touch driving. The row driver and the column driver produce the same environment as a gate driver and column gate driver for driving pixels of AMOLED to fabricate a touch panel.

FIG. 12 is a timing diagram graph illustrating change in voltage of 8×8 touch sensing circuits of a touch sensor in-cell type organic electroluminescent device according to embodiments of the present disclosure according to a touched point.

Referring to FIG. 12, a row driver and a column driver respectively refer to a gate driver and column gate driver for touch driving. The characteristics of a touch panel including the gate driver and the column gate driver were measured.

In addition, FIG. 12 illustrates that a touched position is sensed within 1 column of a touch electrode during a time corresponding to 1 frame.

Referring to FIG. 12, voltage is 700 mV in an untouched state and voltage is 10 V in a touched state. Accordingly, it can be confirmed that a difference between the voltage values is considerably large.

Voltage sensed per corresponding touch electrode is illustrated in FIG. 13.

FIG. 13 is a graph illustrating change in voltage of 8×8 touch sensing circuits of a touch sensor in-cell type organic electroluminescent device according to embodiments of the present disclosure in a touched/untouched state.

FIG. 13 illustrates a touch voltage output sensed according to coordinates (x, y) of the corresponding touch electrode of FIG. 12, and a mapping result of touch sensing output of the 8×8 touch sensing circuits.

Referring to FIG. 13, it can be confirmed that the magnitude of output voltage is varied (different color) depending upon a touched area.

As apparent from the above description, in accordance with embodiments of the present disclosure, the thickness and fabrication costs of a display device may be reduced by integrating a backplane substrate of an organic electroluminescent device with a touch sensor to omit a separate touch panel.

In accordance with embodiments of the present disclosure, simplification of a driving process and reduction of fabrication costs may be accomplished by forming an OLED driving TFT and a touch sensing TFT to share a gate line to drive an OLED (display) and touch sensing with a single driver.

Although the present invention has been described through limited examples and figures, the present invention is not intended to be limited to the examples. Those skilled in the art will appreciate that various modifications, additions and substitutions are possible, without departing from the scope and spirit of the invention.

It should be understood, therefore, that there is no intent to limit the invention to the embodiments disclosed, rather, the invention is to cover all modifications, equivalents, and alternatives falling within the spirit and scope of the invention as defined by the claims.

What is claimed is:

1. A touch sensor in-cell type organic electroluminescent device, comprising:
    at least one OLED-driving Thin-Film Transistor (OLED driving TFT) that is formed on a substrate and drives an organic light emitting device (OLED);
    passivation layers formed on the OLED driving TFT and comprising a first passivation layer, a second passivation layer and a third passivation layer;
    a first contact hole formed through the second passivation layer, and a second contact hole formed through the second passivation layer and the third passivation layer;
    at least two touch-sensing thin-film transistors (touch sensing TFTs) that are simultaneously formed with the at least one OLED driving TFT on the substrate and sense touch; and
    a touch electrode that is formed on the third passivation layer and in the second contact hole and connected to the at least two touch sensing TFTs through the second contact hole and do not overlap with the OLED,
    wherein the touch sensing TFTs comprise a first touch sensing TFT and a second touch sensing TFT,
    wherein the first touch sensing TFT is connected to the touch electrode, adjusts a touch sensing voltage and senses touch,
    wherein the second touch sensing TFT turns off the first touch sensing TFT and performs a reset function of the first touch sensing TFT,
    wherein an anode of the OLED is formed on the second passivation layer and in the first contact hole and connects the at least one OLED driving TFT to the OLED,
    wherein the first touch sensing TFT is turned on according to a gate pulse from a first gate line,
    wherein a gate electrode of the second touch sensing TFT is connected to a second gate line,
    wherein the at least one OLED driving TFT and the second touch sensing TFT share the second gate line,
    wherein a source electrode of the second touch sensing TFT is connected to a source voltage (VSS),
    wherein the first gate line is directly connected to both a source electrode of the first touch sensing TFT and a capacitor,
    wherein the first passivation layer protects the at least one OLED driving TFT and the first touch sensing TFT,
    wherein the second passivation layer planarizes surfaces of the at least one OLED driving TFT and the first touch sensing TFT, and
    wherein the third passivation layer serves as a bank for exposing a light emitting area including the OLED.

2. The touch sensor in-cell type organic electroluminescent device according to claim 1, wherein each of the touch sensing TFTs comprises:
    a gate electrode formed on the substrate;
    a gate insulating film formed on the gate electrode;
    a semiconductor layer formed on the gate insulating film;
    source and drain electrodes that are formed on the semiconductor layer and are spaced apart from each other;
    wherein the passivation layers are formed on the source and drain electrodes; and
    the touch electrode is connected to the drain electrode through the second contact hole,
    wherein the touch electrode is formed on an organic light emitting layer of the OLED.

3. The touch sensor in-cell type organic electroluminescent device according to claim 1, wherein each of the touch sensing TFTs comprises:
    a gate electrode formed on the substrate;
    a gate insulating film formed on the gate electrode;
    a semiconductor layer formed on the gate insulating film; and
    source and drain electrodes that are formed on the semiconductor layer and are spaced apart from each other,
    wherein the passivation layers are formed on the source and drain electrodes,
    the touch electrode is connected to the drain electrode through the second contact hole, and
    wherein the touch electrode is formed under an organic light emitting layer of the OLED.

4. The touch sensor in-cell type organic electroluminescent device according to claim 1, wherein the in-cell type organic electroluminescent device comprises an emission area, in which the OLED is formed, and a touch electrode area, in which the touch electrode is formed, wherein the touch electrode area is 50% or less of a display area.

5. The touch sensor in-cell type organic electroluminescent device according to claim 4, wherein the emission area is less than 50% of a display area.

6. The touch sensor in-cell type organic electroluminescent device according to claim 1, wherein a minimum touch capacitance value of the touch electrode is 0.1 pF to 2 pF.

7. The touch sensor in-cell type organic electroluminescent device according to claim 1, wherein a minimum size of the touch electrode is 2×2 mm$^2$ or less.

8. A display device, comprising the touch sensor in-cell type organic electroluminescent device according to claim 1.

9. A touch sensor in-cell type organic electroluminescent device, comprising:
    at least one display pixel that comprises an OLED and at least one OLED driving TFT;
    at least one touch sensing circuit that comprises at least two touch sensing TFTs;
    passivation layers formed on the at least one OLED driving TFT and comprising a first passivation layer, a second passivation layer and a third passivation layer; and
    a first contact hole formed through the second passivation layer, and a second contact hole formed through the second passivation layer and the third passivation layer,
    wherein the touch sensing TFTs comprise a first touch sensing TFT, a second touch sensing TFT, and a capacitor,
    wherein the first touch sensing TFT is connected to a touch electrode, adjusts a touch sensing voltage and senses touch,
    wherein the second touch sensing TFT turns off the first touch sensing TFT and performs a reset function of the first touch sensing TFT,
    wherein the at least one touch sensing circuit is formed at a side portion of the at least one display pixel,
    wherein the first touch sensing TFT is turned on according to a gate pulse from a first gate line,
    wherein the at least one OLED driving TFT and the two touch sensing TFTs share a second gate line,
    wherein a gate electrode of the second touch sensing TFT is connected to the second gate line,
    wherein a source electrode of the second touch sensing TFT is connected to a source voltage (VSS), wherein the first gate line is directly connected to both a source electrode of the first touch sensing TFT and a capacitor, wherein the first passivation layer protects the at least one OLED driving TFT and the first touch sensing TFT, wherein the second passivation layer planarizes surfaces of the at least one OLED driving TFT and the first touch sensing TFT, and wherein the third passivation layer serves as a bank for exposing a light emitting area including the OLED.

10. The touch sensor in-cell type organic electroluminescent device according to claim 9, wherein the at least one touch sensing circuit additionally comprises a third touch sensing TFT, and a fourth touch sensing TFT.

11. The touch sensor in-cell type organic electroluminescent device according to claim 9, wherein the at least one touch sensing circuit shares a gate driver for driving display pixels to be driven.

12. The touch sensor in-cell type organic electroluminescent device according to claim 9, wherein the at least one touch sensing circuit shares a data driver for driving display pixels to be driven.

\* \* \* \* \*